(12) United States Patent
Yamatoya et al.

(10) Patent No.: US 7,876,799 B2
(45) Date of Patent: Jan. 25, 2011

(54) INTEGRATED SEMICONDUCTOR OPTICAL DEVICE

(75) Inventors: Takeshi Yamatoya, Tokyo (JP); Chikara Watatani, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 471 days.

(21) Appl. No.: 12/099,205

(22) Filed: Apr. 8, 2008

(65) Prior Publication Data

US 2009/0166807 A1 Jul. 2, 2009

(30) Foreign Application Priority Data

Dec. 7, 2007 (JP) ............... 2007-316950

(51) Int. Cl.
*H01S 5/00* (2006.01)
(52) U.S. Cl. .......... 372/50.1; 372/25; 372/43.01; 372/50.11; 372/50.122; 372/81; 257/615; 257/E29.089
(58) Field of Classification Search ........... 372/26, 372/43.01, 50.1, 81, 50.11, 50.122; 257/615, 257/E29.089
See application file for complete search history.

(56) References Cited

U.S. PATENT DOCUMENTS

| 5,946,336 | A | * | 8/1999 | Mizutani et al. | ............ 372/50.1 |
|---|---|---|---|---|---|
| 5,991,322 | A | * | 11/1999 | Takiguchi et al. | ......... 372/50.11 |
| 6,815,786 | B2 | * | 11/2004 | Ogasawara et al. | ......... 257/432 |
| 6,990,131 | B2 | * | 1/2006 | Iga et al. | .................. 372/45.01 |
| 7,368,062 | B2 | | 5/2008 | Ranganath et al. | |
| 7,573,928 | B1 | * | 8/2009 | Pezeshki | .................. 372/50.11 |
| 2003/0042495 | A1 | * | 3/2003 | Ogasawara et al. | ......... 257/102 |
| 2005/0078904 | A1 | | 4/2005 | Sato et al. | |

FOREIGN PATENT DOCUMENTS

| EP | 1 637 907 A2 | 3/2006 |
|---|---|---|
| JP | 05-007053 | 1/1993 |
| JP | 10-223969 | 8/1998 |

OTHER PUBLICATIONS

Miyazaki, Y., Extinction ratio improvement of an electroabsorption modulator by using Be as a p-type dopant with small diffusion coefficient, *Journal of Applied Physics*, 93(7):3823-3826 (2003).

* cited by examiner

*Primary Examiner*—Minsun Harvey
*Assistant Examiner*—Yuanda Zhang
(74) *Attorney, Agent, or Firm*—Leydig, Voit & Mayer, Ltd.

(57) ABSTRACT

A semiconductor laser (a first semiconductor optical device) and an optical modulator (a second semiconductor optical device) are integrated on the same n-type InP substrate. The semiconductor laser butt-joined to the optical modulator. Each of the semiconductor laser and the optical modulator has a Be-doped p-type InGaAs contact layer. The p-type InGaAs contact layers have a Be-doping concentration of $7\times10^{18}$ cm$^{-3}$ or more, and a thickness of 300 nm or less.

1 Claim, 3 Drawing Sheets

INTEGRATED SEMICONDUCTOR OPTICAL DEVICE

BACKGROUND OF THE INVENTION

1. Field of the Invention

The present invention relates to an integrated semiconductor optical device wherein butt-joined first and second semiconductor optical devices are integrated on an InP substrate, and the first and second semiconductor optical devices have a Be-doped InGaAs contact layer. Specifically, the present invention relates to an integrated semiconductor optical device that can reduce contact resistance while maintaining favorable surface morphology.

2. Background Art

In a III-V compound semiconductor formed on an InP substrate, beryllium (Be) is used as a p-type dopant. Be has a shorter diffusion length than zinc (Zn), which is normally used as a p-type dopant. Therefore, if Be is used as a p-type dopant for an electro-absorptive (EA) optical modulator, the concentration of the dopant diffused into the absorption layer can be lowered. Thereby, the electric field of the absorption layer is equalized, and the quenching characteristics are improved (for example, refer to Y. Miyazaki et, al., Journal of Applied Physics, Vol. 93, No. 7, pp. 3823-3826 (2003)).

SUMMARY OF THE INVENTION

However, if a high concentration of Be is doped, the surface morphology of crystals is deteriorated. In particular, in an integrated semiconductor optical device such as an EA modulator integrated laser, two semiconductor optical devices are butt-joined, and in the vicinity of the butt joint, the surface is not flat. Therefore, the deterioration of surface morphology due to the above-described Be doping becomes significant.

A semiconductor laser and an EA modulator formed on an n-type InP substrate have an InGaAs contact layer as the p-side uppermost layer. To lower the contact resistance with the p-side electrode, the contact layer is highly doped to a p-type. However, in a butt-joined integrated device, when Be is used as a p-type dopant, the doping concentration in the contact layer cannot be raised due to the above-described deterioration of surface morphology. Thereby, there was a problem wherein characteristics, such as operation voltage, power consumption and modulating speed, are worsened.

To solve the above-described problem, it is an object of the present invention to provide an integrated semiconductor optical device that can reduce contact resistance while maintaining favorable surface morphology.

According to an integrated semiconductor optical device of the present invention, butt-joined first and second semiconductor optical devices are laminated on an InP substrate. Each of said first and second semiconductor optical devices has a Be-doped InGaAs contact layer. Said InGaAs contact layer has a Be-doping concentration of $7 \times 10^{18}$ cm$^{-3}$ or more, and a thickness of 300 nm or less.

According to the present invention, contact resistance can be reduced while maintaining favorable surface morphology.

Other and further objects, features and advantages of the invention will appear more fully from the following description.

DETAILED DESCRIPTION OF THE PREFERRED EMBODIMENTS

First Embodiment

Figure 1:
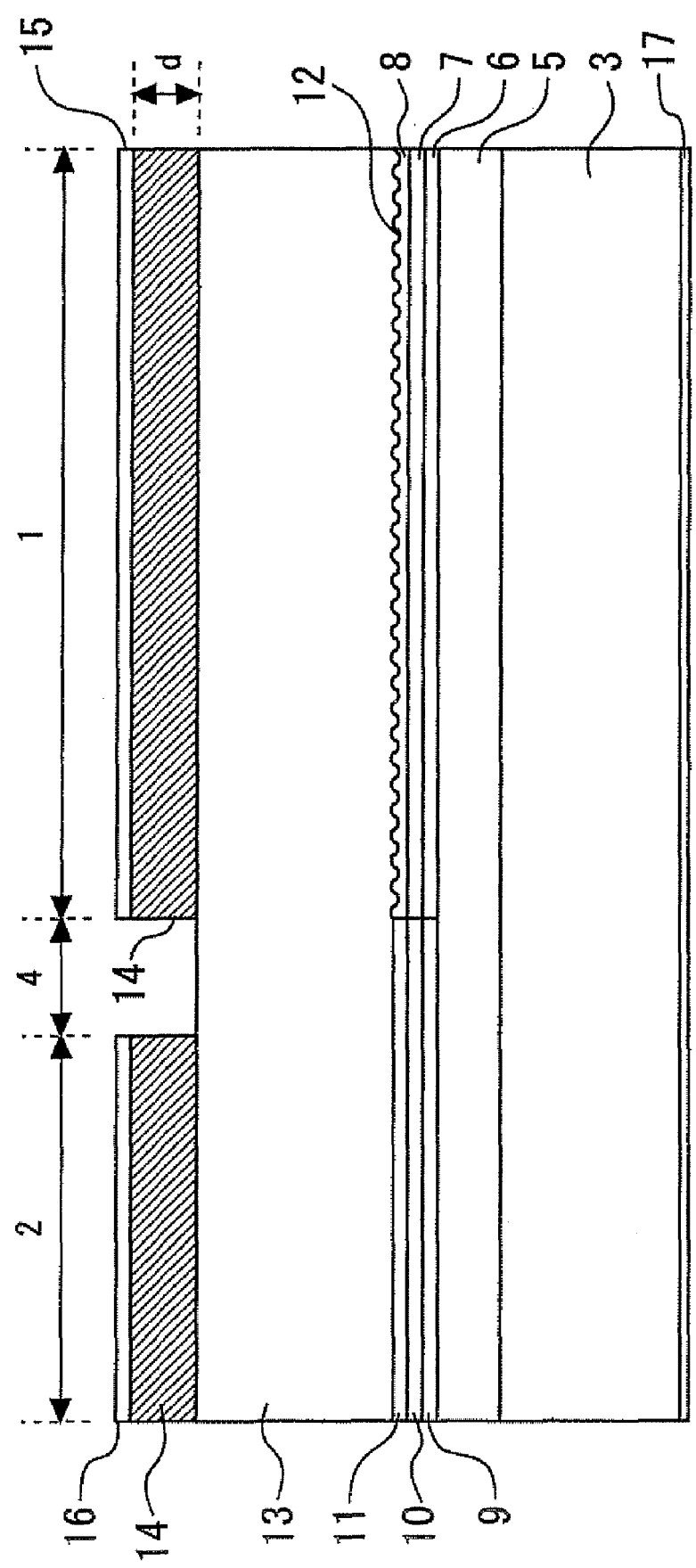
FIG. 1 is a sectional view of an integrated semiconductor optical device according to the first embodiment of the present invention in the optical-waveguide direction.

FIG. 1 is a sectional view of an integrated semiconductor optical device according to the first embodiment of the present invention in the optical-waveguide direction The integrated semiconductor optical device is an optical modulator integrated semiconductor laser wherein a distribution feedback (DFB) semiconductor laser 1 (first semiconductor optical device) and an electro-absorptive (EA) optical modulator 2 (second semiconductor optical device) are monolithically integrated on the same n-type InP substrate 3 (InP substrate). The semiconductor laser 1 and the optical modulator 2 are electrically isolated by an isolation section 4. An optical waveguide for generating and radiating laser beams is composed of the semiconductor laser 1 and the optical modulator 2.

An n-type InP clad layer 5 is formed on the n-type InP substrate 3. On the n-type InP substrate 3, a non-doped InGaAsP separate confinement heterostructure (SCH) layer 6, an active layer 7 composed of a non-doped InGaAsP/InGaAsP multiple quantum well, and a non-doped InGaAsP SCH layer 8 are laminated as the semiconductor laser 1. On the other hand, a non-doped InGaAsP SCH layer 9, an absorption layer 10 composed of a non-doped InGaAsP/InGaAsP multiple quantum well, and a non-doped InGaAsP SCH layer 11 are laminated as the optical modulator 2. A diffractive grating 12 is formed on the SCH layer 8 by cyclic etching. The SCH 6, 8, and the active layer 7 of the semiconductor laser 1, and the SCH layer 9, 11; and the absorption layer 10 of the optical modulator 2 are butt-joined.

A p-type InP clad layer 13 is formed on the SCH layer 8 of the semiconductor laser 1 and the SCH layer 11 of the optical modulator 2, and a Be-doped p-type InGaAs contact layer 14 is formed thereon. Specifically, the semiconductor laser 1 and the optical modulator 2 have the p-type InGaAs contact layer 14 as the uppermost layer. The p-type InGaAs contact layer 14 is removed in the isolation section 4. On the p-type InGaAs contact layer 14, a p-type electrode 15 of the semiconductor laser 1 and a p-type electrode 16 of the optical modulator 2 are formed. An n-type electrode 17 is formed on the lower surface of the n-type InP substrate 3.

The present embodiment is characterized in that the p-type InGaAs contact layer 14 has a Be-doping concentration of $7 \times 10^{18}$ cm$^{-3}$ or more, and a thickness of 300 nm or less. Effects of this structure will be explained in detail below.

Figure 2:
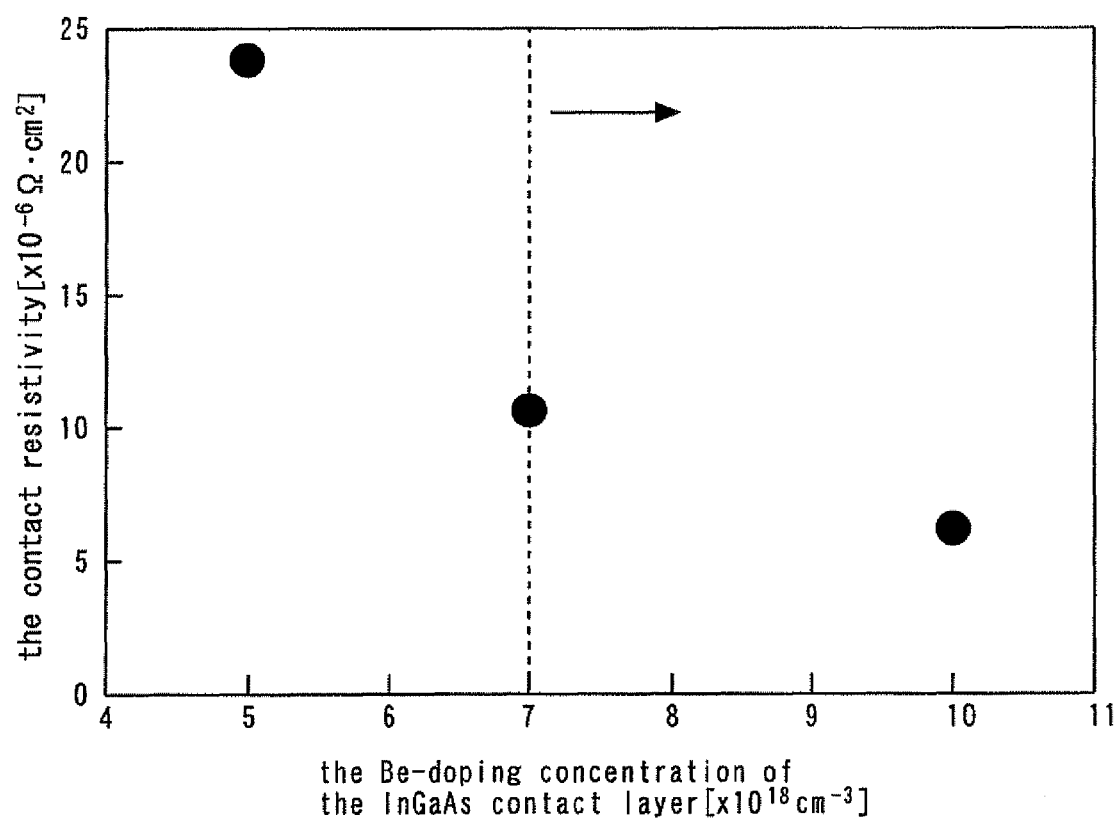
FIG. 2 is a graph showing a result of measuring the contact resistivity when a Be-doped p-type InGaAs contact layer is formed on an InP substrate, and a Ti/Pt/Au layer is formed as a p-type electrode.

FIG. 2 is a graph showing a result of measuring the contact resistivity when a Be-doped p-type InGaAs contact layer is formed on an InP substrate, and a Ti/Pt/Au layer is formed as a p-type electrode. The abscissa represents the Be-doping concentration in the InGaAs contact layer, and the ordinate represents the contact resistivity. It is known that the contact resistivity is lowered with increase in the Be-doping concentration.

Thereby, since the contact resistivity can be sufficiently lowered by raising the Be-doping concentration of the p-type InGaAs contact layer 14 to $7 \times 10^{18}$ cm$^{-3}$ or more, an optical modulator integrated semiconductor laser with high-speed modulation, low power consumption and low heat generation can be realized.

Surface conditions were measured after a butt-joined semiconductor laser and an optical modulator had been grown by a metal-organic chemical vapor deposition (MOCVD) method. When the Be-doping concentration of an InGaAs contact layer was $5\times10^{18}$ cm$^{-3}$ and the thickness thereof was 1,000 nm, substantially favorable surface morphology could be obtained although there were some morphology roughing. On the other hand, when the Be-doping concentration is raised to $1\times10^{19}$ cm$^{-3}$ with the same thickness, the surface morphology was deteriorated in the vicinity of butt joints. Thus, the surface morphology was deteriorated as the Be-doping concentration of the InGaAs contact layer was higher.

However, to lower contact resistivity as described above, the Be-doping concentration of the p-type InGaAs contact layer 14 must be $7\times10^{18}$ cm$^{-3}$ or higher. Therefore, when the Be-doping concentration of the InGaAs contact layer 14 was raised to $1\times10^{19}$ cm$^{-3}$, and the thickness thereof was lowered to 50 nm and 100 nm, favorable surface morphology was obtained from the both.

Thereby, even if the Be-doping concentration of the p-type InGaAs contact layer 14 is $7\times10^{18}$ cm$^{-3}$ or higher, favorable surface morphology is obtained by reducing the thickness of the p-type InGaAs contact layer 14 to less than 300 nm.

Second Embodiment

Figure 3:
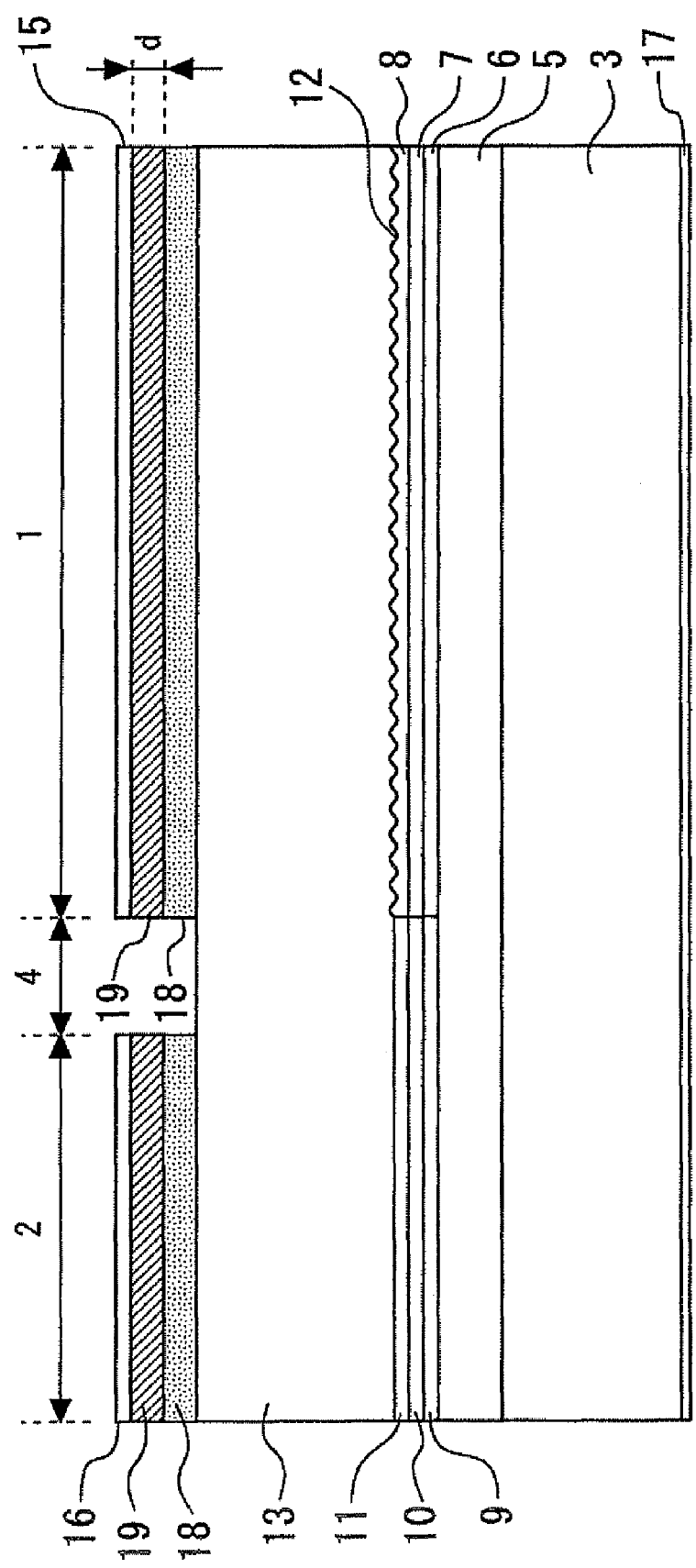
FIG. 3 is a sectional view of an integrated semiconductor optical device according to the second embodiment of the present invention in the optical-waveguide direction.

FIG. 3 is a sectional view of an integrated semiconductor optical device according to the second embodiment of the present invention in the optical-waveguide direction. Here, only the configuration different from the configuration of the first embodiment will be described.

A Be-doped p-type InGaAs contact layer 18 and a Be-doped p-type InGaAs contact layer 19 are laminated on a p-type InP clad layer 13. Specifically, a semiconductor laser 1 and an optical modulator 2 have p-type InGaAs contact layers 18 and 19 as uppermost surface layers. The p-type InGaAs contact layer 18 and the p-type InGaAs contact layer 19 have Be-doping concentrations different from each other. The p-type InGaAs contact layer 19, which is present on the uppermost surface of the p-type InGaAs contact layers 18 and 19, has a Be-doping concentration of $7\times10^{18}$ cm$^{-3}$ or higher, and a thickness of 300 nm or less. The p-type InGaAs contact layer 18 has a Be-doping concentration of $5\times10^{18}$ cm$^{-3}$ and a thickness of 400 nm. Thereby, an equivalent effect as the effect of the first embodiment can be obtained. Furthermore, when the thickness of the p-type InGaAs contact layer 18 is 200 nm, an equivalent effect as the effect of the first embodiment can also be obtained.

The thickness of the entire InGaAs contact layer, specifically, the total thickness of the p-type InGaAs contact layer 18 and the p-type InGaAs contact layer 19 can be larger than the thickness of the p-type InGaAs contact layer 14 alone as in the first embodiment. Thereby, the freedom of the structural design of the device can be improved. For example, since the metal diffusion of InGaAs is less than the metal diffusion of InP, InGaAs has a role to prevent the sinking of the electrode metal to the active layer causing the deterioration of the device; however, the effect can be more significant by thickening the InGaAs contact layer. Also in the present embodiment, although the Be-doping concentration of the p-type InGaAs contact layer 18 is lower than the Be-doping concentration of the p-type InGaAs contact layer 19, the Be-doping concentration of the p-type InGaAs contact layer 18 may be higher than the Be-doping concentration of the p-type InGaAs contact layer 19. Thereby, resistance between the p-type InGaAs contact layer and the InP clad layer can be lowered, while preventing the deterioration of surface morphology.

Although the present embodiment is described for the case of but not limited to, two p-type InGaAs contact layers, the p-type InGaAs contact layer may be of a laminated structure composed of three or more layers having different Be-doping concentrations.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-316950, filed on Dec. 7, 2007 including specification, claims, drawings and summary, on which the Convention priority of the present application is based, are incorporated herein by reference in its entirety.

What is claimed is:

1. An integrated semiconductor optical device comprising: butt-joined first and second semiconductor optical devices laminated on an InP substrate, wherein
    each of said first and second semiconductor optical devices has a plurality of Be-doped InGaAs contact layers,
    said Be-doped InGaAs contact layers have respective different Be-doping concentrations, and
    uppermost surfaces, with respect to said InP substrate, of said plurality of Be-doped InGaAs contact layers have a Be-doping concentration of at least $7\times10^{18}$ cm$^{-3}$, and a thickness not exceeding 300 nm.

* * * * *